US009202594B2

(12) United States Patent
Hickey et al.

(10) Patent No.: US 9,202,594 B2
(45) Date of Patent: Dec. 1, 2015

(54) DEVICE AND METHOD TO PERFORM A PARALLEL MEMORY TEST

(71) Applicant: INSIDE SECURE, Meyreuil (FR)

(72) Inventors: Graeme Hickey, Glasgow (GB); Stuart Kincaid, Glasgow (GB)

(73) Assignee: INSIDE SECURE, Meyreuil (FR)

( * ) Notice: Subject to any disclaimer, the term of this patent is extended or adjusted under 35 U.S.C. 154(b) by 0 days.

(21) Appl. No.: 14/376,263

(22) PCT Filed: Nov. 29, 2012

(86) PCT No.: PCT/EP2012/073966
§ 371 (c)(1),
(2) Date: Aug. 1, 2014

(87) PCT Pub. No.: WO2013/113426
PCT Pub. Date: Aug. 8, 2013

(65) Prior Publication Data
US 2015/0063045 A1    Mar. 5, 2015

(30) Foreign Application Priority Data

Feb. 1, 2012  (GB) .................................. 1201755.4

(51) Int. Cl.
*G11C 7/00* (2006.01)
*G11C 29/26* (2006.01)
*G11C 29/50* (2006.01)

(52) U.S. Cl.
CPC ................ *G11C 29/26* (2013.01); *G11C 29/50* (2013.01); *G11C 2029/2602* (2013.01)

(58) Field of Classification Search
CPC ............................. G11C 5/04; G11C 2207/107
USPC .......................................... 365/201, 219–221
See application file for complete search history.

(56) References Cited

U.S. PATENT DOCUMENTS

| 5,982,684 A | 11/1999 | Schwartzlow et al. |
| 2005/0216808 A1 | 9/2005 | Poechmueller |
| 2006/0006419 A1 | 1/2006 | Shin et al. |
| 2008/0151659 A1 * | 6/2008 | Sakuma et al. ............... 365/200 |

OTHER PUBLICATIONS

Mar. 21, 2013 International Search Report issued in International Application No. PCT/EP2012/073966.
Mar. 21, 2013 Written Opinion issued in International Application No. PCT/EP2012/073966.

* cited by examiner

*Primary Examiner* — Han Yang
(74) *Attorney, Agent, or Firm* — Oliff PLC

(57) ABSTRACT

The invention relates to a semiconductor device including N memory modules, N being greater than or equal to three, each module having an array of memory cells arranged in rows and columns, a write circuit coupled to each module and configured to write data in the memory cells, a read circuit coupled to each module and configured to supply output data from the memory cells, a module selection circuit configured to individually select one memory module in a regular operation mode, and to collectively select two or more of the modules in a parallel mode, and a comparator circuit coupled to the N modules and configured to compare, in the parallel mode, the output data supplied by the N modules.

9 Claims, 3 Drawing Sheets

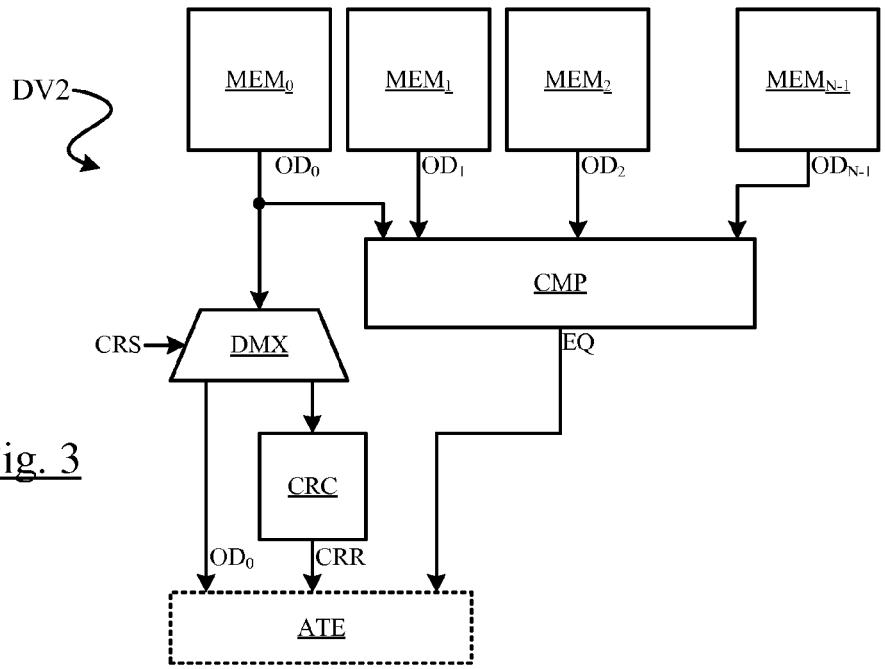
Fig. 3
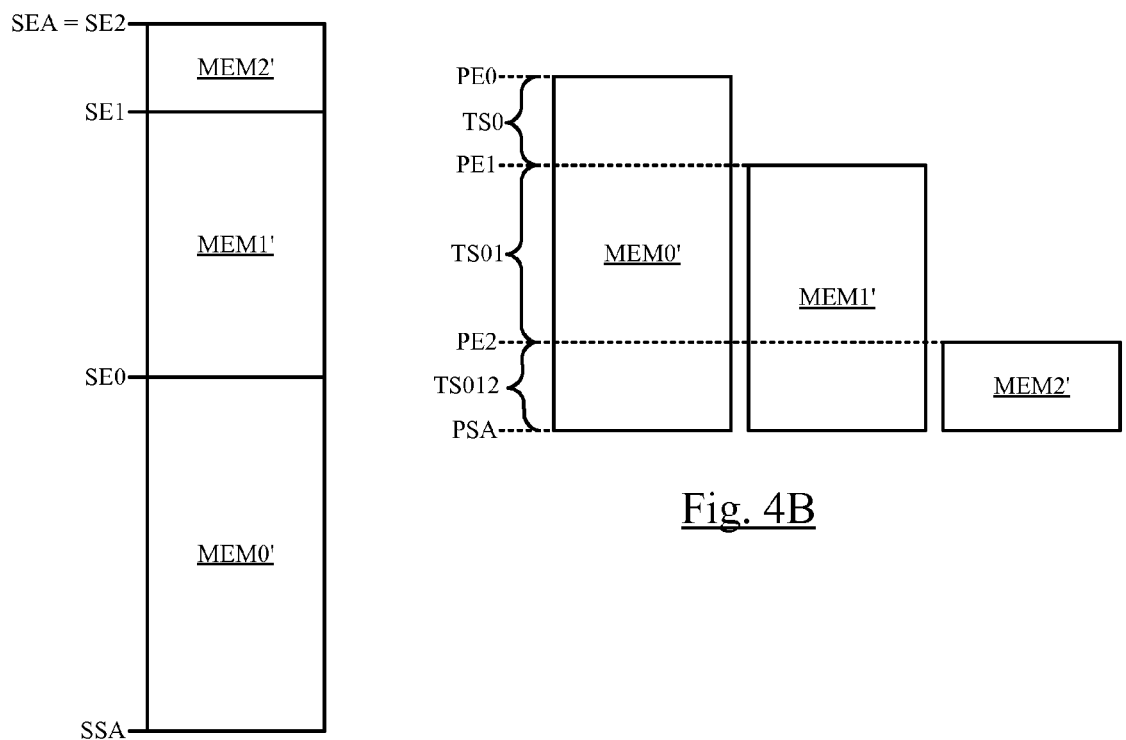
Fig. 4A
Fig. 4B

DEVICE AND METHOD TO PERFORM A PARALLEL MEMORY TEST

The present invention relates to a semiconductor device comprising a plurality of memory modules, and configured to perform a parallel test of writing and reading data in the memory modules. The present invention also relates to a method of performing such a parallel test.

After fabrication, a semiconductor device is usually subjected to a test process comprising write/read/erase cycles of test data, such as all 0's, then all 1's, then alternating 0's and 1's, in memory cells of a memory module in order to identify faulty cells and modules. Nevertheless, when the device comprises a plurality of memory modules, a serial test of one module after the other can be quite lengthy, depending on the number of cycles to be carried out, the number of modules, and the number of memory cells in the modules. Parallel testing of several modules at the same time has therefore been developed to speed up the test process.

Figure 1:
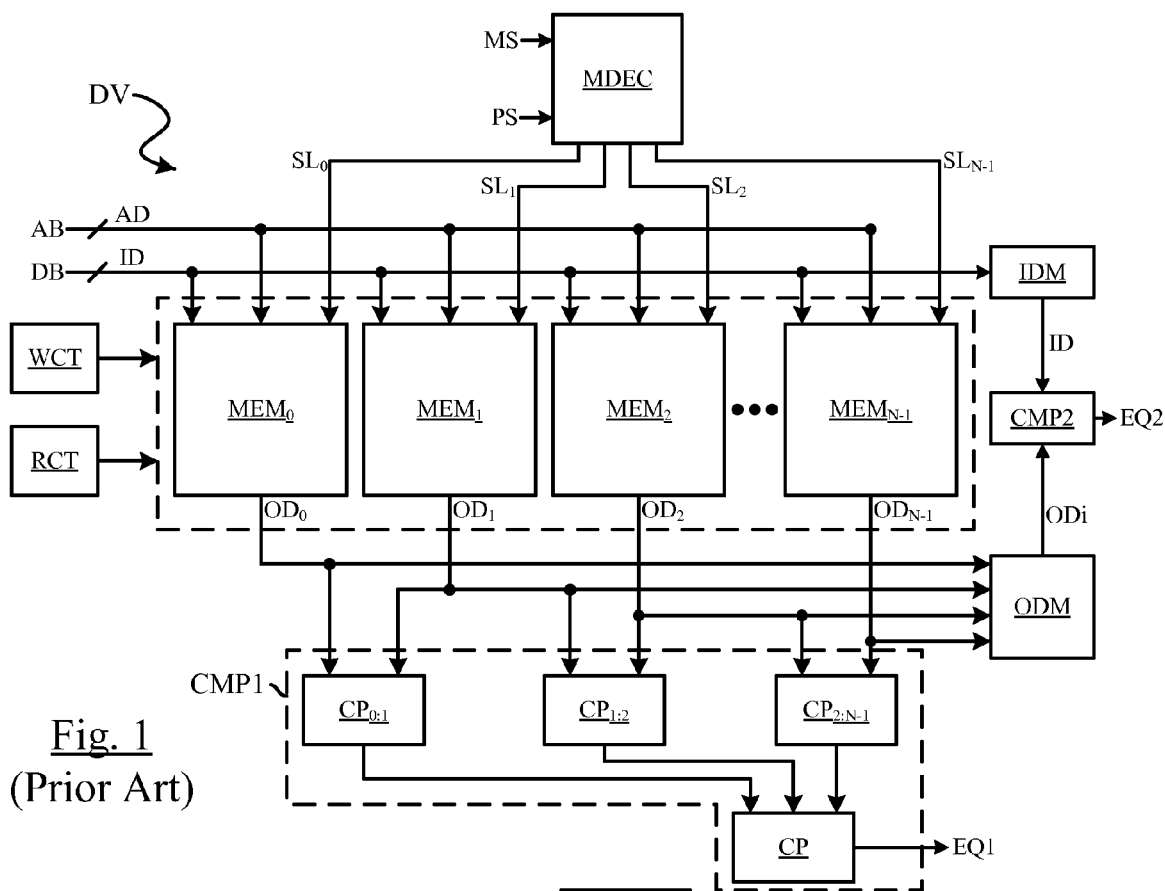

FIG. 1 shows a semiconductor device DV comprising a plurality of memory modules and configured to perform a parallel test along the lines of the teaching of U.S. Pat. No. 5,982,684. The device DV comprises a total of N memory modules MEMi, i being the module reference from 0 to N−1, thus $MEM_0$, $MEM_1$, $MEM_2$ ... $MEM_{N-1}$. The device DV further comprises write circuitry WCT and read circuitry RCT coupled to each module, a module decoder MDEC, an address bus AB, a data bus DB, an input data memory IDM, an output data multiplexor ODM, a first comparator CMP1, and a second comparator CMP2.

Each memory module MEMi receives on input an address AD from the address bus AB, input data ID from the data bus DB, and a corresponding select signal SLi from the module decoder MDEC. The module decoder MDEC receives on input a parallel signal PS and a module signal MS, and supplies on output the select signals SLi (here $SL_0$, $SL_1$, $SL_2$ ... $SL_{N-1}$). Each memory module supplies output data ODi (here $OD_0$, $OD_1$, $OD_2$, $OD_{N-1}$) to the first comparator CMP1.

Comparator CMP1 comprises a total of N−1 first-level comparators $CP_{i:i+1}$ (here $CP_{0:1}$, $CP_{1:2}$ ... $CP_{2:N-1}$), and one second-level comparator CP. Each first-level comparator receives the output data ODi on input from two consecutive memory modules, and supplies on output a comparison signal to the second-level comparator CP, which in turn supplies a first equal signal EQ1.

The input data memory IDM is coupled to the data bus DB, receives and stores the input data ID, and supplies on output the input data ID to the second comparator CMP2. The output data multiplexor ODM is coupled to the N memory modules, transferring the output data ODi from one of the memory modules to the comparator CMP2 on output. Comparator CMP2 thus receives the input data ID from memory IDM and the output data ODi from the multiplexor ODM, and supplies on output a second equal signal EQ2.

During a parallel test mode, a parallel write is performed by setting the parallel signal PS to 1 (logic high value). The module decoder MDEC selects all N modules $MEM_0$ ... $MEM_{N-1}$ by means of select signals $SL_0$ ... $SL_{N-1}$. The input data ID present on the data bus DB is written at the same address AD of all modules, and is also stored in the input data memory IDM. A parallel read is then performed by setting the signal PS to 1, or by keeping it at 1 if the parallel read is performed immediately after the write. The data stored in the memory cells indicated by the address AD of each module are read and supplied as output data ODi to the first comparator CMP1. Comparator CMP1 compares the output data from all the modules, and sets the first equal signal EQ1 to 1 if the data are the same.

Meanwhile, the output data multiplexor ODM receives the output data ODi supplied by one of the memory modules MEMi, and transfers it to the second comparator CMP2. Comparator CMP2 compares the output data supplied by the multiplexor ODM with the input data ID supplied by the input data memory IDM, and sets the second equal signal EQ2 to 1 if the input data ID and the output data ODi are the same. Thus, equal signals EQ1, EQ2 are configured to indicate whether all the memory modules have the same data and whether the output data is correct.

Nevertheless, such a process allows only a limited amount of test data to be verified at a time, depending on the size of the input data memory IDM. Additionally, certain elements such as the input data memory IDM, the output data multiplexor ODM, and second comparator CMP2 are required only for the parallel test phase, and are unnecessary for the normal operation.

It may therefore be desired to provide a semiconductor device configured to perform a parallel test with fewer constraints.

Embodiments of the invention relate to a semiconductor device comprising N memory modules, N being greater than or equal to three, each module comprising an array of memory cells arranged in rows and columns, a write circuit coupled to each module and configured to write data in the memory cells, a read circuit coupled to each module and configured to supply output data from the memory cells, a module selection circuit configured to individually select one memory module in a regular operation mode, and to collectively select two or more of the modules in a parallel mode, and a comparator circuit coupled to the N modules and configured to compare, in the parallel mode, the output data supplied by the N modules. The N memory modules comprise one module designated as the reference module and N−1 modules designated as auxiliary modules, the comparator circuit is configured to compare the output data supplied by each auxiliary module with the output data supplied by the reference module, and the semiconductor device is configured to supply the output data from the reference module to a data verification means.

According to one embodiment, the device further comprises a circuit configured to perform a cyclical redundancy check on the output data supplied by the reference module, and to supply a result to the data verification means.

According to one embodiment, the verification means is built-in self test circuit coupled to the module selection circuit, the comparator circuit, and to the reference module.

According to one embodiment, the comparator circuit further comprises means to enable and disable a comparison of output data supplied by an auxiliary module with the output data supplied by the reference module, depending on the status of a module select signal.

According to one embodiment, at least two of the memory modules comprise different numbers of rows of memory cells, and the memory module comprising the greatest number of rows is designated as the reference array.

According to one embodiment, the module selection circuit is configured to receive on input a parallel signal and an address signal, supply on output N module select signals, one signal per module, and deselect one or more select signals regardless of the parallel signal being set in a high logic state.

Embodiments of the invention also relate to a method of testing N memory modules in parallel, N being greater than or equal to three, comprising the steps of writing an input data at an address in each of the memory modules, reading the data at the address of the modules to obtain output data, determining whether the output data from the modules are identical. The method further comprises the steps of designating one of the modules as the reference module and the N−1 other modules as auxiliary modules, comparing the output data from each of the auxiliary modules being tested with the output data from the reference module, and supplying the output data from the reference module to a data verification means.

According to one embodiment, the method comprises the steps of determining the largest memory module, and designating the largest memory module as the reference module.

According to one embodiment, the method further comprises, during a parallel operation, the step of selecting a subset of at least two of the N memory modules according to an address belonging to a test space common to the subset of modules.

Figure 2:
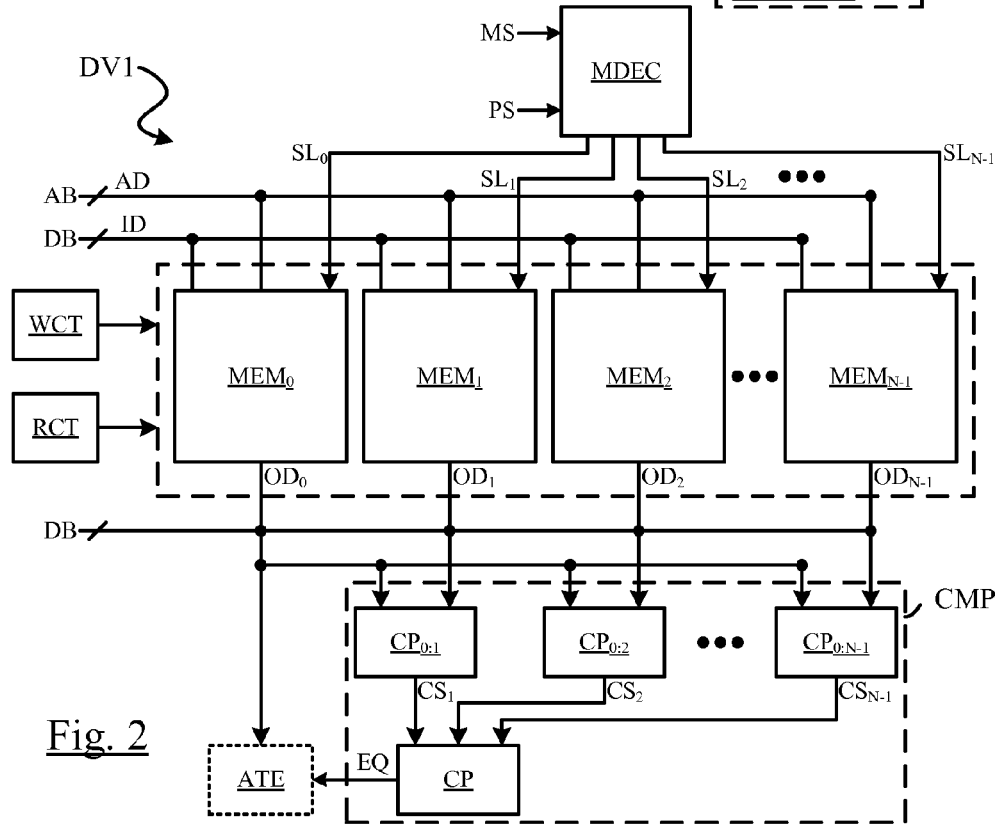
Figure 5:
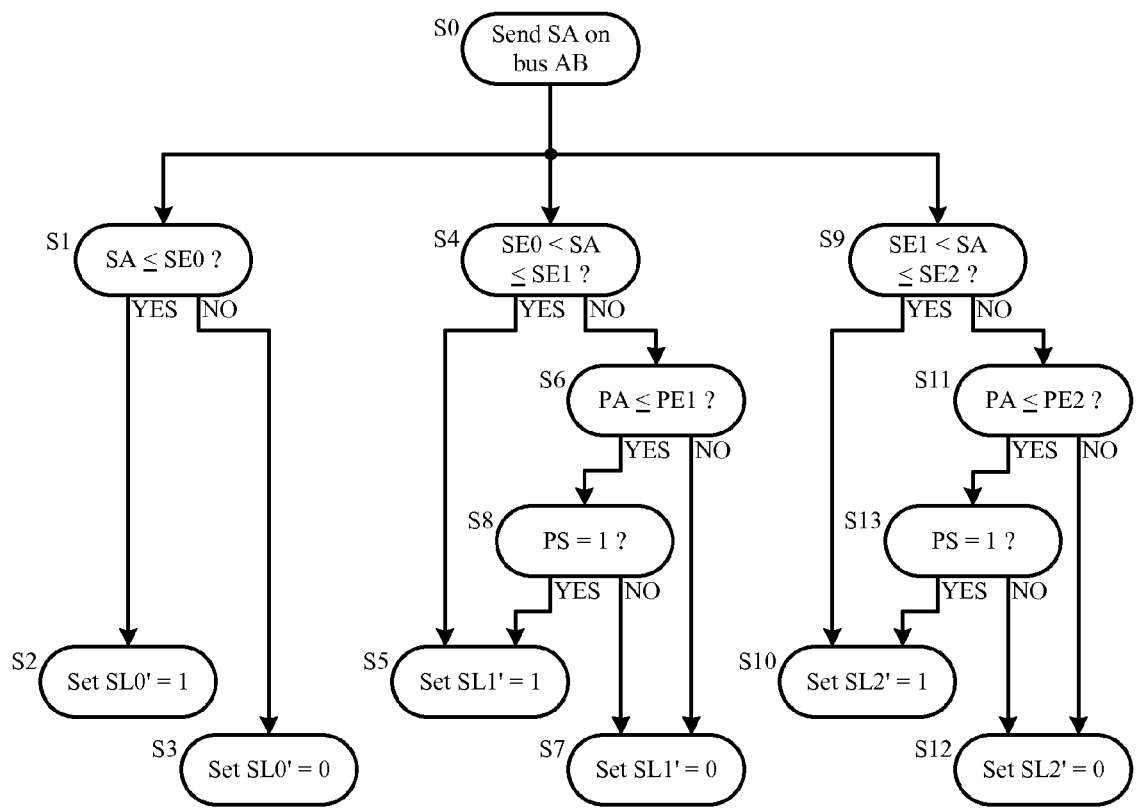
Figure 6:
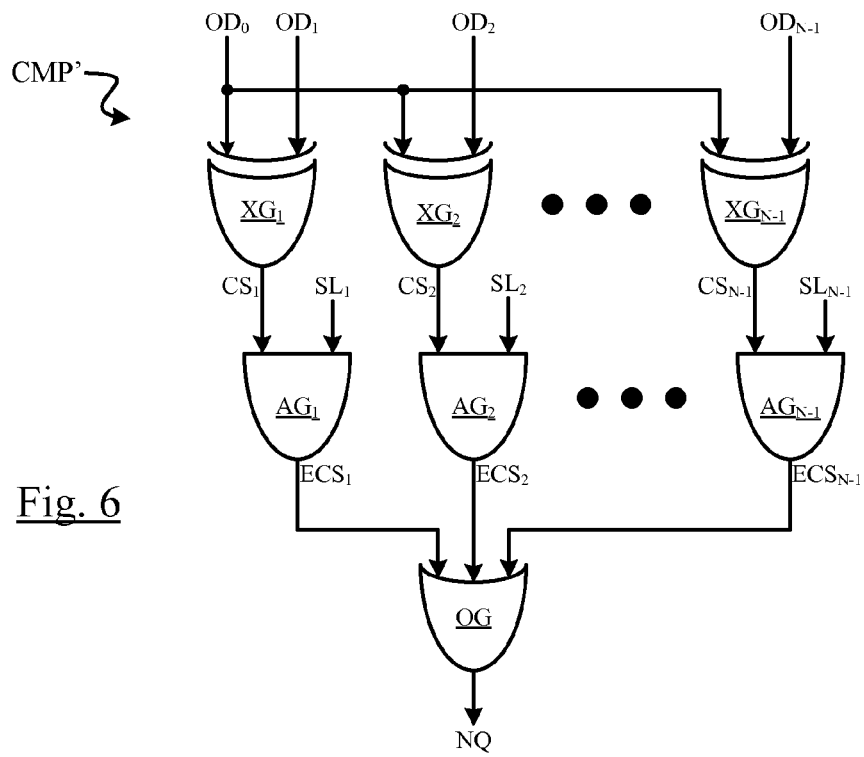

Embodiments of the present invention will now be described in connection with, but not limited to, the appended drawings in which:

FIG. 1, previously described, shows a conventional semiconductor device configured to perform parallel testing, FIG. 2 shows a semiconductor device configured to perform parallel testing according to an embodiment of the invention, FIG. 3 shows a portion of a semiconductor device configured to perform parallel testing according to another embodiment of the invention, FIGS. 4A and 4B respectively show system address mapping and physical address mapping of memory modules, FIG. 5 is a flowchart of a module selection process according to one embodiment of the invention, and FIG. 6 is an output data comparator according to one embodiment of the invention.

Embodiments of the invention relate to a semiconductor device comprising a plurality of memory modules and configured to perform a parallel testing of the memory modules, wherein one memory module is designated as a reference module and the other memory modules are designated as auxiliary modules.

FIG. 2 shows a semiconductor device DV1 according to one embodiment of the invention. The device DV1 comprises a total of N memory modules MEMi, N being equal to at least three and i being the module reference number from 0 to N−1, thus $MEM_0$, $MEM_1$, $MEM_2$ . . . $MEM_{N-1}$. Each memory module comprises an array of memory cells arranged in rows and columns. Module $MEM_0$ is designated as the reference module, and the N−1 other modules $MEM_1$ . . . $MEM_{N-1}$ are designated as the auxiliary modules. The semiconductor device DV1 further comprises write circuitry WCT and read circuitry RCT coupled to each module, a module decoder MDEC, an address bus AB, a data bus DB, and an output data comparator circuit CMP.

Each memory module MEMi receives on input an address AD from the address bus AB, input data ID from the data bus DB, and a corresponding select signal SLi ($SL_0$, $SL_1$, $SL_2$ . . . $SL_{N-1}$) from the module decoder MDEC. The module decoder MDEC receives on input a parallel signal PS and a module signal MS, and supplies on output the select signals SLi accordingly. Each memory module MEMi supplies output data ODi (here $OD_0$, $OD_1$, $OD_2$ . . . $OD_{N-1}$) to the comparator CMP and to the data bus DB (connection of the output data to the bus not shown in FIG. 2) for regular operation of the semiconductor device.

The comparator CMP comprises a total of N−1 first-level comparators $CP_{0:1}$, $CP_{0:2}$ . . . $CP_{0:N-1}$, and one second-level comparator CP. The first-level comparators $CP_{0:1}$, $CP_{0:2}$ . . . $CP_{0:N-1}$ each receive on one input the output data $OD_0$ from the reference memory module $MEM_0$ and on another input the output data $OD_1$, $OD_2$ . . . $OD_{N-1}$ from an auxiliary memory module $MEM_1$, $MEM_2$ . . . $MEM_{N-1}$ respectively. The comparators $CP_{0:1}$, $CP_{0:2}$ . . . $CP_{0:N-1}$ each supply on output a comparison signal $CS_1$, $CS_2$ . . . $CS_{N-1}$ to the second-level comparator CP. In turn, the comparator CP supplies on output an equal signal EQ.

The semiconductor device DV1 is further coupled to an automated test equipment ATE. The equipment ATE may be external to the device, such as a probe card and tester, or may be a built-in self-test circuit "BIST". In one embodiment, the equipment ATE receives on input the output data $OD_0$ supplied by the reference memory module MEM0 and the equal signal EQ supplied by the comparator CMP, and supplies on output the module signal MS, the parallel signal PS, the address AD, the test input data ID to the module decoder MDEC, the address bus AB, the data bus DB, and the write and read circuitry WCT, RCT.

A control circuit may also be supplied through which the module decoder MDEC, address bus AB, data bus DB, and the write/read circuitry WCT, RCT are coupled to the automated test equipment ATE, and also controlling these elements during normal operation.

During a parallel test mode, a parallel write is performed by setting the parallel signal PS to 1 (logic high value). The module decoder MDEC selects all N modules $MEM_0$ . . . $MEM_{N-1}$ by means of select signals $SL_0$ . . . $SL_{N-1}$. The input data ID on the data bus DB is written at the same address AD of all modules. A parallel read is then performed by setting (or keeping) the parallel signal to 1. The data stored in the memory cells indicated by the address AD of each module are read and supplied as output data ODi to the comparator CMP.

Comparator CMP compares the output data from each of the auxiliary modules with the output data from the reference module. The equal signal EQ is set to 1 if the output data $OD_1$ . . . $OD_{N-1}$ from all the auxiliary modules are equal to the output data $OD_0$ from the reference module. Meanwhile, the output data $OD_0$ from the reference module MEM0 is supplied to the automated test equipment ATE, which verifies the correctness of the output data.

FIG. 3 shows a portion of a semiconductor device DV2 capable of performing parallel testing according to another embodiment of the invention. Device DV2 differs from device DV1 shown in FIG. 2 only in that a demultiplexor DMX is provided in the path of the output data $OD_0$ between the output of reference module $MEM_0$ and the equipment ATE. The demultiplexor DMX is controlled by a cyclical redundancy calculation enable signal CRS, supplied by the automated test equipment ATE or by a control circuit. Signal CRS directs the output data $OD_0$ either to a cyclical redundancy circuit CRC or directly to the automated test equipment ATE. The cyclical redundancy circuit CRC performs error checking before sending a cyclic redundancy result CRR to the automated equipment ATE. This embodiment is preferred when a serial output of the string of data $OD_0$ on a single port of the device is undesired, due to time constraints.

Parallel Testing of Memory Modules of Different Sizes

Conventionally, parallel testing of multiple memory modules has been limited to modules of the same size. Nevertheless, the semiconductor device may comprise modules of different sizes, for example to optimize the layout of a large memory of an integrated circuit upon a semiconductor substrate.

FIGS. 4A, 4B respectively show a system address SA mapping and a physical address PA mapping of three memory modules MEM0', MEM1', MEM2' of unequal sizes. The largest memory module, here module MEM0', is designated as the reference module. The other memory modules MEM1', MEM2' are designated as the auxiliary modules. Preferably but not essentially, they are referenced in decreasing size, such that module MEM0' is larger than module MEM1', which is larger than module MEM2'.

As shown in the system view in FIG. 4A, the memory modules MEM0', MEM1', MEM2' are perceived by the device as being a continuous memory space, comprising a system start address SSA and a system end address SEA. Each module MEM0', MEM1', MEM2' has a system end address SE0, SE1, SE2 respectively.

As shown in the physical view in FIG. 4B, the memory modules MEM0', MEM1', MEM2' are physically non-continuous, and may be physically separated from each other. Each module MEM0', MEM1', MEM2' has a physical end address PE0, PE1, PE2 respectively, and a same physical start address PSA. Furthermore, test spaces TS0, TS01, TS012 of the physical modules are defined. Test space TS012 comprises the physical addresses common to all memory modules MEM0', MEM1', MEM2', test space TS01 comprises the physical addresses common to the memory modules MEM0', MEM1', and test space TS0 comprises the physical addresses unique to memory module MEM0'. The write and read of the test space TS0 is done individually for module MEM0' since module MEM0' was designated as the reference module, i.e. that having the greatest number of rows.

In the following, for ease of explanation, the memory addresses are given in decimal format, but any known format for addressing memory space may be used. As a numerical example, it is assumed that the semiconductor device comprises a total of 2000 memory cells, module MEM0' comprising 1000 memory cells, module MEM1' comprising 750 memory cells, and module MEM2' comprising 250 memory cells. A total of 2000 addresses are allocated to the memory modules, from 000 to 1999. Memory module MEM0' has a system address range from system start address SSA=000 to address SE0=999, module MEM1' has a system address range from address 1000 to address SE1=1749, and module MEM2' has a system address range from address 1750 to address SEA=SE2=1999.

Memory module MEM0' has a physical address range from the physical start address PSA=000 to address PE0=999, module MEM1' has a physical address range from address PSA=000 to address PE1=749, and module MEM2' has a physical address range from address PSA=000 to address PE2=249. Test space TS012 comprises the physical addresses from address PSA=000 to PE2=249 (common to all memory modules), test space TS01 comprises the addresses from 250 to PE1=749 (common to memory modules MEM0', MEM1' only), and test space TS0 comprises the addresses from 750 to PEA=PE0=999 (unique to memory module MEM0').

FIG. 5 is a flow chart of a memory module selection process for memory modules of unequal sizes, according to one embodiment, with the numerical values provided above in relation to FIGS. 4A and 4B. As module MEM0' was designated as the reference module, the addressing of its physical address space is used for parallel testing.

The selection process comprises steps S0 to S13. In step S0, the system address SA corresponding to the memory cells to be selected for write, read, or erase is sent on the address bus AB to the module decoder MDEC. The process then simultaneously proceeds to steps S1, S4, S9.

In step S1, the module decoder determines whether address SA is less than or equal to the system end address SE0, thus SA≤SE0 [SA≤999]. If the response is yes, the process proceeds to step S2 in which a module MEM0' select signal SL0' is set to 1 (logic high). If the response at step S1 is no, the process proceeds to step S3 in which the select signal SL0' is set to 0 (logic low).

In step S4, the module decoder determines whether the system address SA is greater than the system end address SE0 and less than or equal to the system end address SE1, thus SE0<SA≤SE1 [999<SA≤1749]. If the response is yes, the process proceeds to step S5 in which a module MEM1' select signal SL1' is set to 1. If the response at step S4 is no, the process proceeds to step S6. In step S6, the physical address PA is determined, and it is determined whether the physical address is less than or equal to the physical end address PE1, thus PA≤PE1 [PA≤749]. If the response is no, the process proceeds to step S7 in which the select signal SL1' is set to 0. Otherwise, if the response at step S6 is yes, the process proceeds to step S8 in which it is determined whether the parallel signal PS is set to 1 (i.e. activated). If the response is yes, then the process goes to step S5 in which the module MEM1' select signal SL1' is set to 1. Otherwise, if the response at step S6 is no, the process goes to step S7, and the select signal SL1' is set to 0.

Likewise, in step S9, the module decoder determines whether the system address SA is greater than the system end address SE1 and less than or equal to the system end address SE2, thus SE1<SA≤SE2 [1749<SA≤1999]. If the response is yes, the process proceeds to step S10 in which a module MEM2' select signal SL2' is set to 1. If the response at step S9 is no, the process proceeds to step S11. In step S11, the physical address PA is determined, and it is determined whether the physical address is less than or equal to the physical end address PE2, thus PA≤PE2 [PA≤249]. If the response is no, the process proceeds to step S12 in which the select signal SL2' is set to 0. Otherwise, if the response at step S11 is yes, the process proceeds to step S13 in which it is determined whether the parallel signal PS is set to 1. If the response is yes, then the process goes to step S10 in which the select signal SL2' is set to 1. Otherwise, if the response at step S13 is no, the process goes to step S12, and the module MEM2' select signal SL2' is set to 0.

In summary, if the system address SA falls within the designated system range for any memory module MEM0', MEM1', MEM2', then the corresponding select signal is set to 1, regardless of the state of the parallel signal PS. If however the system address SA does not fall within the designated system range for an auxiliary module MEM1', MEM2', then the physical address PA is determined. If neither the system address SA nor the physical address PA fall within the designated system/physical ranges, the select signal is set to 0, regardless of the state of the parallel signal.

If however the physical address PA falls within the designated physical range for the auxiliary memory module MEM1', MEM2' and the parallel signal is set to 1, then the select signal is set to 1, selecting the module for a parallel operation along with the reference module MEM0'. On the other hand, if the physical address falls within the range designated for an auxiliary memory module MEM1', MEM2' but the parallel signal PS is set to 0, then the select signal is set to 0.

NUMERICAL EXAMPLES

Example 1 system address SA=700, parallel signal PS=0. Signal SL0' is set to 1, and signals SL1', SL2' are set to 0.

Example 2 system address SA=500, parallel signal PS=1. Signals SL0', SL1' are set to 1, and signal SL2' is set to 0.

Example 3 system address SA=200, parallel signal PS=1. Signals SL0', SL1', SL2' are set to 1.

FIG. 6 shows a comparator circuit CMP' according to one embodiment. The comparator circuit CMP' is suited for use with a semiconductor device comprising either memory modules of equal size, as shown in FIG. 2, or comprising memory modules of unequal sizes, as shown in FIG. 4B. Comparator CMP' receives on input the output data $OD_0 \ldots OD_{N-1}$ from each memory module and the select signals $SL_1 \ldots SL_{N-1}$ from the module decoder MDEC, and supplies on output a not equal signal NQ.

The comparator CMP' comprises a total of N−1 first-level 'exclusive or' 'XOR' logic gates $XG_1, XG_2 \ldots XG_{N-1}$, a total of N−1 AND logic gates $AG_1, AG_2 \ldots AG_{N-1}$, and one OR gate OG. Each XOR gate $XG_1 \ldots XG_{N-1}$ receives on one input the output data $OD_0$ from the reference memory module and on one input the output data $OD_1 \ldots OD_{N-1}$ respectively from one auxiliary memory module, and supplies on output a respective comparison signal $CS_1 \ldots CS_{N-1}$. Each AND logic gate $AG_1 \ldots AG_{N-1}$ receives on one input the comparison signal $CS_1 \ldots CS_{N-1}$ from its corresponding XOR gate and on one input the corresponding select signal $SL_1 \ldots SL_{N-1}$, and supplies on output an enabled comparison signal ECSi ($ECS_1, ECS_2 \ldots ECS_{N-1}$) respectively. Finally, the OR gate OG receives on input the enabled comparison signals $ECS_1 \ldots ECS_{N-1}$ from each of the AND gates $AG_1 \ldots AG_{N-1}$ respectively and supplies on output the not equal signal NQ.

In operation, the comparison signal CSi supplied by an XOR gate $XG_i$ is set to 1 if the output data from the auxiliary module does not match the output data from the reference module. The output of the AND gate AGi will therefore be set to 1 if both the output data are different and the auxiliary module is selected for parallel read. If however the output data are the same (logic 0), the enabled comparison signal ECSi is set to logic 0, which therefore has no effect on the evaluation of the output data from the other modules. Moreover, if the data are not the same (logic 1) yet the select signal is set to logic 0, the enabled comparison signal ECSi is also set to logic 0, which also has no effect on the evaluation of the output data from the other modules. For example, in the case of parallel testing of memory modules of different sizes or if one of the modules is corrupt, its select signal is set to 0 so as to not affect the not equal result supplied by the comparator CMP'.

During a parallel test mode of uneven memory module sizes, a parallel write is performed by setting the parallel signal PS to logic 1 (logic high value). The test input data ID is applied on the data bus DB and is presented to all the modules, but is only written in the modules selected by the module decoder MDEC. The addressing of the memory space thus begins, based on the physical space of module MEM0', starting at physical start address PSA=000. The module decoder MDEC selects modules MEM0', MEM1', MEM2' by means of select signals SL0', SL1', SL2'. The input data ID on the data bus DB is written at the same address AD of all modules. As the address increases, the data is written in the test space TS012 until the physical end address PE2 is reached, at which point the module decoder sets the select signal SL2' to 0, deselecting the module MEM2'. The process continues, writing data in the test space TS01, and setting select signal SL1' to 0 once the physical end address PE1 is reached. Finally, test space TS0 is written individually.

A parallel read is then performed by setting (or keeping) the parallel signal to 1. As before, the addresses of the physical space of module MEM0' are cycled through, with the module decoder MDEC setting the select signals SLi to 0 once their physical ranges are no longer included. The data stored in the memory cells indicated by the address AD of each module are read and supplied as output data ODi to the comparator CMP'. The setting of the select signals to 0 by the module decoder also affects the comparison of the output data by the comparison circuit CMP'. The AND gates have their outputs set to 0, preventing any interference of the unequal memory sizes on the data comparison, that is to say, to prevent a false result of the not equal signal NQ.

The skilled person will understand that the module decoder MDEC, address bus AB, data bus DB, write circuit WCT, and read circuit RCT may be used to perform normal memory operations of writing, reading, and erasing of memory cells in the memory modules. During a normal operation, the comparison circuit CMP and parallel signal PS may be disabled, or have their values ignored.

Furthermore, the module selection process as set forth in relation to FIG. 5 and/or the comparison circuit CMP' shown in FIG. 6 may be implemented with memory modules of equal sizes. For example, it may be desired to perform a parallel test on only a subset of the memory modules, in which case, the corresponding select signals are set to 1 as needed, enabling the modules and the comparison on output.

It will further be understood by the skilled person that the method of testing a semiconductor device according to the invention is susceptible of various implementation variations. For example, the testing method as described above may be performed either before the semiconductor wafer is diced (singulated) into individual chips, or else performed on each individual chip after dicing.

Other physical implementations may also be envisaged. For example, the memory modules may be located on separate supports, such as on separate semiconductor chips.

Furthermore, it will be understood by the skilled person that other methods of module decoding other than that shown in FIG. 5 may be provided. For example, instead of simultaneous steps S1, S4, S9, the process may first determine whether the select signal SL0 is to be set to 1, then whether signals SL1, SL2 are to be set to 1 depending on the state of the parallel signal PS. Alternatively, the module selection process may first determine the state of the parallel signal, and then determine which module(s) is (are) to be selected, depending on the physical and system addresses. Individual selection of two or more non-continuous system memory modules out of the N available modules may also be provided, for example to compare the output data from modules MEM0' and MEM2' without comparing the output data from module MEM1'.

Rather than de-selecting a memory module, its output may be masked, filtered, or otherwise disregarded. The module decoder may further supply an address AD to all of the memory modules, along with the select signal SLi, in which case the memory modules are not linked to an address bus.

Finally, the signals and values may be reversed, for example "not equal" instead of "equal" signals, etc. depending upon the logic and logic gates employed.

A semiconductor device according to the invention is susceptible of being integrated in portable devices, such as mobile phones, music players, etc., as well as any other device that may have multiple memory modules.

The invention claimed is:

1. Semiconductor device comprising:
N memory modules, modules, N being greater than or equal to three, each module comprising an array of memory cells arranged in rows and columns,
a write circuit coupled to each module and configured to write data in the memory cells,
a read circuit coupled to each module and configured to supply output data from the memory cells,
a module selection circuit configured to individually select one memory module in a regular operation mode, and to collectively select two or more of the modules in a parallel mode, and
a comparator circuit coupled to the N modules and configured to compare, in the parallel mode, the output data supplied by at least two of the N modules, wherein:
the N memory modules comprise one module designated as the reference module and N−1 modules designated as auxiliary modules,
the comparator circuit is configured to compare the output data supplied by each auxiliary module with the output data supplied by the reference module, and
the semiconductor device is configured to supply the output data from the reference module to a data verification means.

2. Device according to claim 1, further comprising a circuit configured to perform a cyclical redundancy check on the output data supplied by the reference module, and to supply a check result to the data verification means.

3. Device according to claim 1, wherein the verification means is built-in self test circuit coupled to the module selection circuit, the comparator circuit, and to the reference module.

4. Device according to claim 1, wherein the comparator circuit further comprises means to enable and disable a comparison of output data supplied by an auxiliary module with the output data supplied by the reference module, depending on the status of a module select signal.

5. Device according to claim 1, wherein at least two of the memory modules comprise different numbers of rows of memory cells, and the memory module comprising the greatest number of rows is designated as the reference array.

6. Device according to claim 5, wherein the module selection circuit is configured to:
receive on input a parallel signal and a module signal,
supply on output N module select signals, one signal per module, and
deselect one or more select signals regardless of the state of the parallel signal.

7. Method of testing N memory modules in parallel, N being greater than or equal to three, comprising the steps of:
writing an input data at an address in each of the memory modules,
reading the data at the address of the modules to obtain output data,
determining whether the output data from the modules are identical,
wherein:
designating one of the modules as the reference module and the N−1 other modules as auxiliary modules,
comparing the output data from each of the auxiliary modules being tested with the output data from the reference module, and
supplying the output data from the reference module to a data verification means.

8. Method according to claim 7, comprising the steps of:
determining the largest memory module, and
designating the largest memory module as the reference module.

9. Method according to claim 8, further comprising, during a parallel operation, the step of selecting a subset of at least two of the N memory modules according to an address belonging to a test space common to the subset of modules.

* * * * *